United States Patent [19]

Henze

[11] Patent Number: 4,745,356

[45] Date of Patent: May 17, 1988

[54] METHOD AND APPARATUS FOR QUICKLY AND PRECISELY MEASURING THE FREQUENCY OF A SIGNAL

[75] Inventor: Werner Henze, Hohnhorst, Fed. Rep. of Germany

[73] Assignee: Blaupunkt-Werke GmbH, Hildesheim, Fed. Rep. of Germany

[21] Appl. No.: 39,677

[22] Filed: Apr. 17, 1987

[30] Foreign Application Priority Data

Apr. 26, 1986 [DE] Fed. Rep. of Germany ....... 3614272

[51] Int. Cl.⁴ ........................................... G01R 23/02
[52] U.S. Cl. .............................. 324/78 D; 324/77 H
[58] Field of Search ................ 324/77 R, 78 R, 79 R, 324/79 D, 78 D, 77 C, 77 CS, 77 B; 328/133

[56] References Cited

U.S. PATENT DOCUMENTS 3,086,172 4/1963 Johnson ........................... 324/77 H
3,909,714 9/1975 Nakano ............................ 324/78 D
4,270,209 5/1981 Albanese ......................... 324/77 CS Primary Examiner—Michael J. Tokar
Attorney, Agent, or Firm—Frishauf, Holtz, Goodman & Woodward

[57] ABSTRACT

In a method for measuring the frequency of a signal, in which counting pulses are counted and the counting result is emitted in the form of a digital signal, the counting pulses are derived from clock pulses, and the frequency of all the counting pulses is equivalent to a multiple of the frequency of the clock pulses. The counting pulses appear at various taps of a delay chain and are counted with the aid of a plurality of counters. After at least one period or one portion of the period of the signal has elapsed, the contents of the counters are added together.

15 Claims, 6 Drawing Sheets

| | A | B | C | D | E | F | G | H |
|---|---|---|---|---|---|---|---|---|
| 51 | 417' | 421' | 425' | 429' | 401' | 405' | 409' | 413' |
| 52 | 401 | 405 | 409 | 413 | 417 | 421 | 425 | 429 |
| 53 | 418' | 422' | 426' | 430' | 402' | 406' | 410' | 414' |
| 54 | 402 | 406 | 410 | 414 | 418 | 422 | 426 | 430 |
| 55 | 419' | 423' | 427' | 431' | 403' | 407' | 411' | 415' |
| 56 | 403 | 407 | 411 | 415 | 419 | 423 | 427 | 431 |
| 57 | 420' | 424' | 428' | 432' | 404' | 408' | 412' | 416' |
| 58 | 404 | 408 | 412 | 416 | 420 | 424 | 428 | 432 |

METHOD AND APPARATUS FOR QUICKLY AND PRECISELY MEASURING THE FREQUENCY OF A SIGNAL

The present invention relates generally to a method of measuring the frequency of a signal and, more particularly, to measurement by conversion of the input to a digital signal and processing of that digital signal through a delay chain.

BACKGROUND

It is known to measure the frequency of a signal by counting cycles during a predetermined time interval and calculating, from the count, a cycles-per-second figure. This method cannot, however, be used with signals whose frequency constantly changes, unless one wishes to measure the average or middle frequency.

It is also known to determine the period, or cycle of a signal by the counting of pulses. In order to obtain a sufficiently high resolution in the result, one needs clock pulses whose frequency is significantly higher than the frequency sought to be measured. In particular, high-resolution measurement of FM intermediate frequency signals yields values, for the known methods, that cannot be attained with known component parts. For instance, if such a signal in the intermediate frequency band (10.7 MHz) is to be detected with an accuracy of 12 bits, then for the least significant bit it must be possible to detect a period or cycle difference of 0.32 picoseconds ($sec^{-12}$). A measuring method that attains this precision is not realizable. With the required precision, even if the intermediate frequency signal is reduced into the base band, realizable values are not obtained. At least 614.4 MHz would be required as a counting frequency. This cannot be realized either, for the most various reasons.

THE INVENTION

The method according to the invention has the advantage that frequency measurement of the intermediate frequency signal is possible with extremely high resolution, using available electronic components. The method according to the invention is not restricted to measuring intermediate frequency signals, but can instead be used for other signals within the competence of one skilled in the art. It also has the advantage that the measured value is available in digital form as an output value, thus enabling subsequent digital processing of the signal.

DRAWINGS

An exemplary embodiment of the invention is shown in the drawing and described in further detail below.

FIG. 2b shows the signals at points 21, and 25-28 of FIG. 2a;

Figures 3A, 3B:
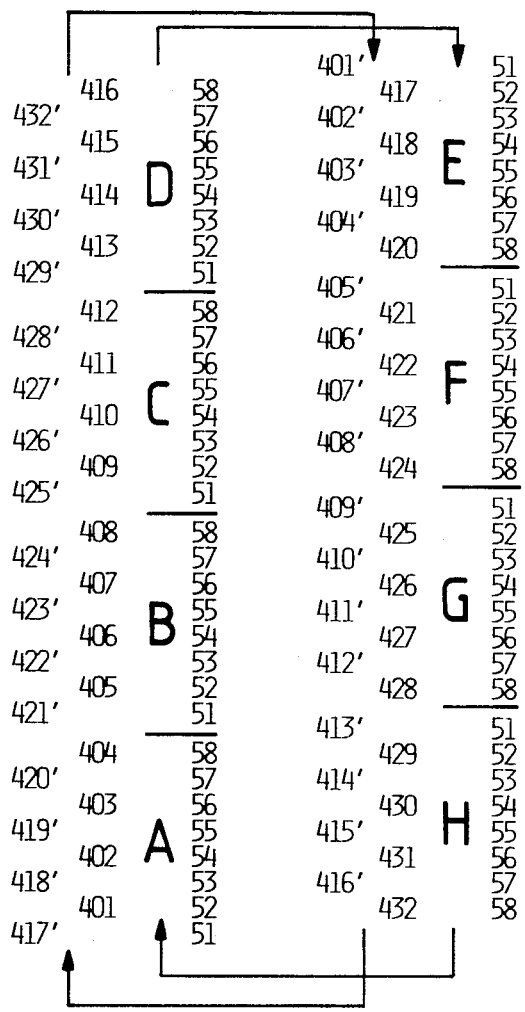
Figure 4:
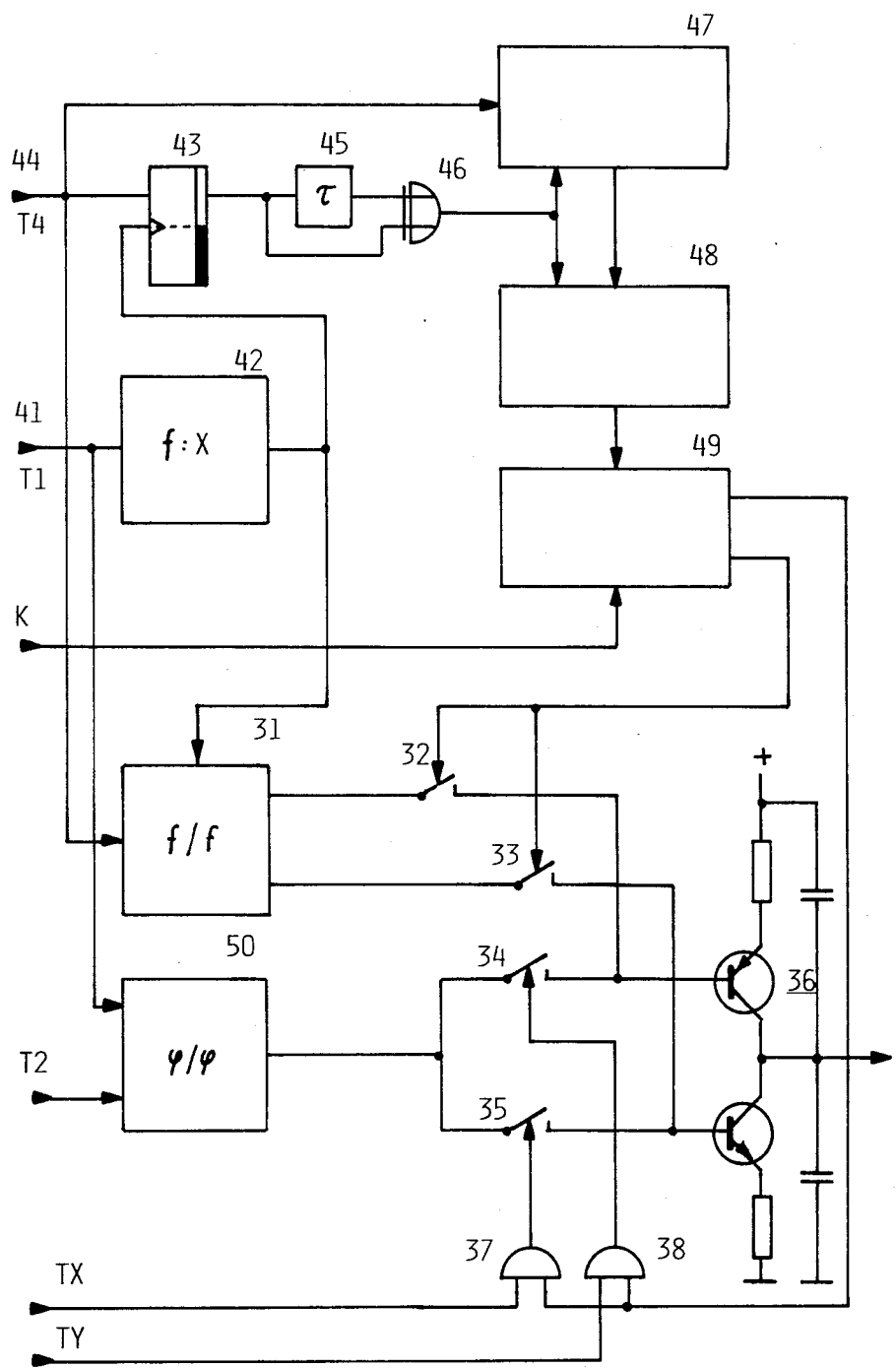
Figure 5:
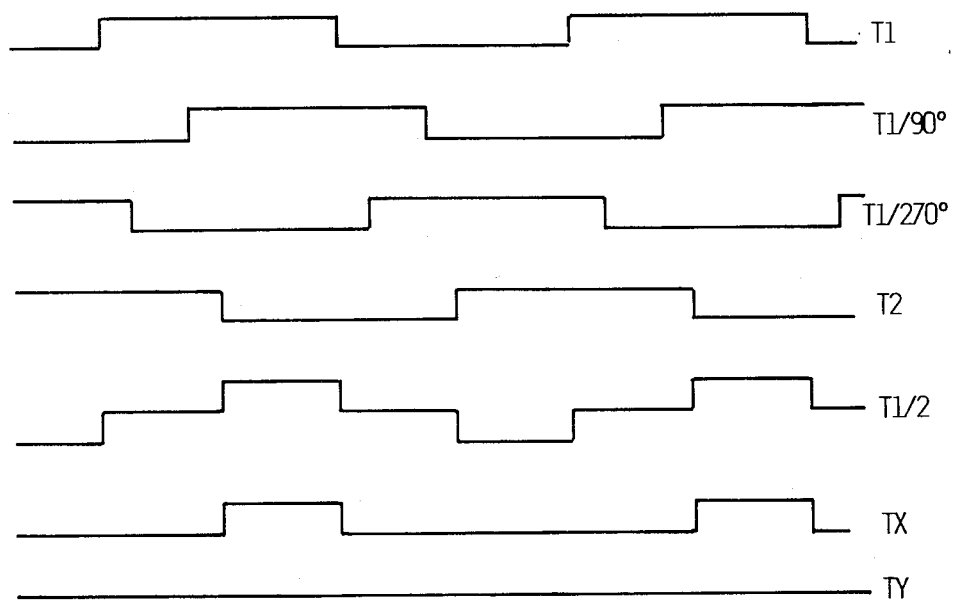
Figure 5:
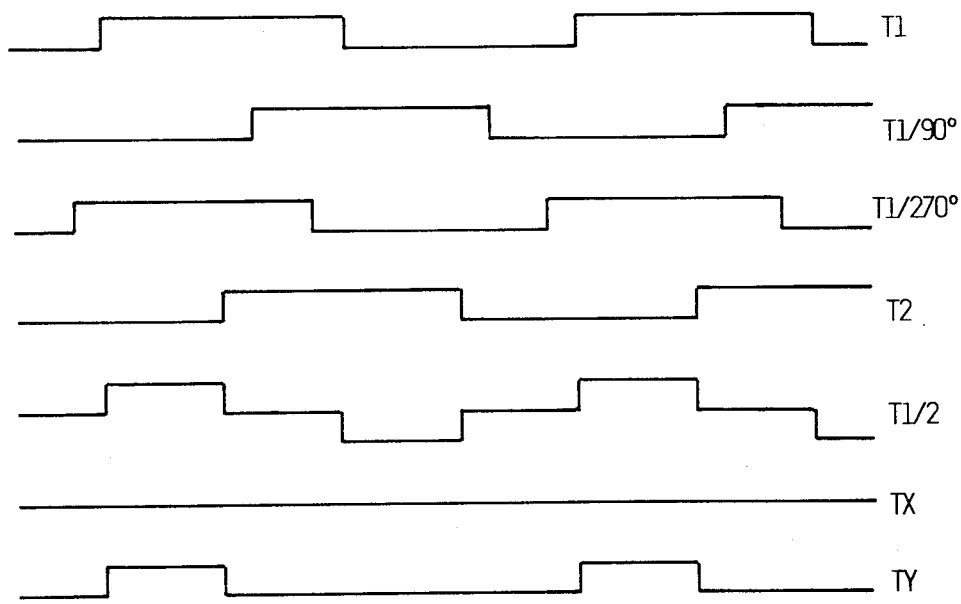

FIGS. 3a and 3b provides are respectively a diagram and a table showing the association of the outputs of the pulse formers with inputs of OR-gates within the circuit of FIG. 1;

FIG. 4 is a block circuit diagram of a frequency and phase comparator used in the circuit of FIG. 1; and FIG. 5 provides diagrams of the signals produced with the frequency and phase comparator of FIG. 4.

DETAILED DESCRIPTION

Identical elements are provided with the same reference numerals in the various drawing figures.

The circuit of FIG. 1 is supplied at 1 with an FM intermediate frequency signal, which is mixed in a mixing circuit with an IF carrier, which is supplied at 3. With the aid of a filter 4 connected to the mixing circuit 2, the base band, which in the FM broadcast band has a band width of 150 kHz, is filtered out of the mixed product. This base band is fed to a limiter 5, the output of which is supplied with a rectangular signal the frequency of which corresponds to the particular deviation of the FM signal.

The generation of clock or sampling pulses T1, in a circuit according to FIG. 1, is effected with the aid of a controllable oscillator (VCO) 6, which is controllable by a frequency and phase comparator 7. The frequency and phase comparator 7 is supplied at 8 with a clock signal T4 having a reference frequency. The frequency of the clock pulses T1 emitted by the controllable oscillator 6 is 15.625 MHz. The clock pulses are carried via a delay chain 100, comprising thirty-two elements or gates 101-132. An element or gate delays the clock pulses by 2 nanoseconds ($sec^{-9}$) at a time. The clock T1 and the clock pulses that have passed through the entire delay chain 100 are fed to the frequency and phase comparator 7.

In a manner to be described in further detail below, the controllable oscillator 6 is controlled, by comparison of the retarded clock pulses T2 and the clock pulses T1, in such a manner that the period or cycle of the clock pulses T1 is exactly equivalent to 32 times the delay of one element 101-132. At the taps or terminals of the delay chain 100, including its input and its output, pulses are accordingly applied that are each retarded by 2 nanoseconds relative to one another. These pulses are each fed to one input of one of the AND-gates 201-232.

The output signal of the limiter 5 is fed to the other inputs of the AND-gates 201-232. One pulse former 301-332 is connected to each output of the AND-gates 201-232. These pulse formers each have two outputs, at which two temporarily displaced output pulses arise as a consequence of an input pulse. Because the pulses T1 are meandering in form, a pulse arises in alternation at the two outputs of each pulse former 301-332, at an interval of 32 nanoseconds —until such time as the positive half-wave of the signal to be measured is present at the output of the limiter 5. In FIGS. 1 and 3, the outputs of the pulse formers 301-332 are identified as 401-432 and 401'-432'.

Because of the high frequency of all the output pulses of the pulse formers 301-332 taken together, eight counters 61-68 are required for counting the entire number of pulses. The association of the clock inputs of the counters to the outputs 401-432 of the pulse formers 301-332 is effected via OR-gates 51-58, each of which has 8 inputs A-H. The distribution of the counting pulses 401'-432' is effected according to the diagram of FIG. 3, to the inputs A-H of the OR-gates 51-58. The distribution is selected such that the counting pulses at the inputs A-H of one OR-gate are always at the same temporal interval and do not succeed one another too closely, so that the clock or operating rate limit of the subsequent counter is not exceeded. By providing a greater number of OR-gates and counters, counters that are suitable only for lower clock frequencies can also be used.

Once the period of cycle counting has been completed—the output signal of the limiter 5 is then equal to zero—the measured value is to be formed, from all the counter states. To this end, a summation of all the counters must be effected in the shortest possible time. By means of a shift register, which comprises the flip-flops 71-79 and is set to the value 1 at the beginning of the summation, the counter states are connected in succession through to an adder. To this end, the outputs of the flip-flops 71-79 are connected to output registers of the counters 61-68. In the connected state, the outputs of the counters are low-impedance, while otherwise they are high-impedance.

The clock signal T3 for the shift registers 71-79 is obtained from the clock pulses T1 using the frequency divider 81. As soon as the limited FM IF signal has become zero, the flip-flop 82 is set. After that, with the next clock pulse T3, the flip-flop 83 is set as well and thus the clock rate for the shift register 71-79 is made available via the AND-gate 85.

With the positive edge of the shift clock pulse T3, the particular counter state is sent to the adder 86, and upon each negative edge of the shift clock pulse the result in the adder 86 is taken over into a summing memory 87, to which end the clock signal T3 is fed to the control input 88 of an input register of the summing memory 87. The intermediate result thus stored in the summing memory 87 is used as a term of the sum again during the next addition.

The last flip-flop 79 of the shift register no longer sends a counter state through to the adder 86 but instead terminates the summing formation, in that it resets the shift register 71-79 to the value of 1, resets or clears the two flip-flops 82, 83 and the counters 61-68, and transfers the value of the summing memory 87 to an output memory 89. At the output 90 of the output memory, the measured result is then available in digital form.

Once the measured result has been transferred from the summing memory 87 to the output memory 89, the summing memory 87 is also erased. To this end, a corresponding signal is fed from the output of the flip-flop 79 via a retarding circuit 91 to a reset input 92 of the summing memory 87.

The values in the output memory are inversely proportional to the FM frequency deviation and may optionally be converted by inverse value formation into values that are porportional to the frequency. Since when the frequency deviation, that is, the instantaneous deviation of the frequency of the modulated signal from the associated carrier, is measured the algebraic sign ($\pm$) of this difference is also significant, an algebraic sign bit is derived, as will be described below. To this end, both the carrier and the FM signal are fed, each via a respective limiter 93, 94, to a further frequency and phase comparator 95, with the two output signals of which a flip-flop 96 is controlled, at the output 97 of which the algebraic sign bit can be picked up.

Figure 2A:
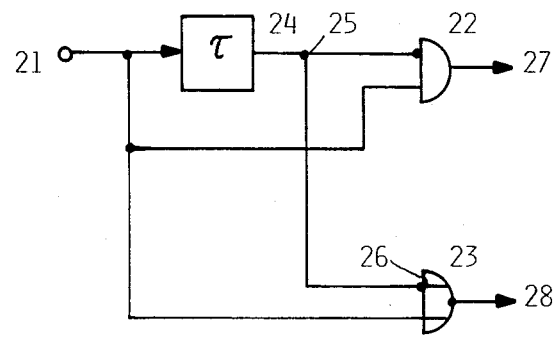
FIG. 2a is a block circuit diagram of a pulse former used in the circuit of FIG. 1.
Figure 2B:
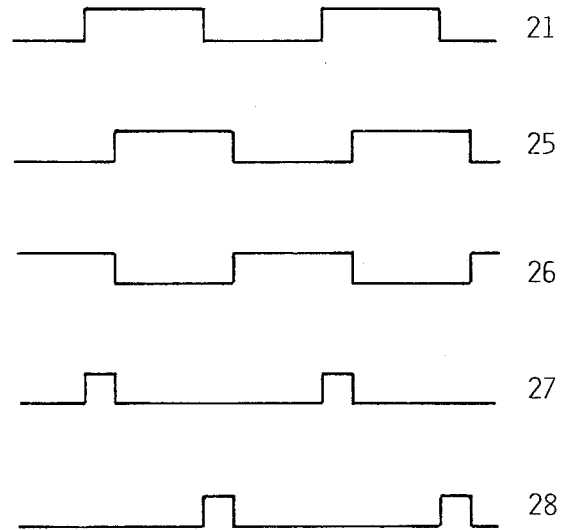

The pulse formers 301-332 will now be explained, referring to FIG. 2. FIG. 2a is a block circuit diagram for one of the pulse formers, and FIG. 2b shown diagrams of the signals that arise. The individual lines in FIG. 2b are provided with the same reference numerals as the circuit points in FIG. 2a at which the signals shows arise.

The input 21 of the pulse former is connected to the output of one of the AND-gates 201-232 (see FIG. 1a) and receives the meandering pulses shown in line 21 of FIG. 2b. These pulses are fed to an input of an AND-gate 22 and an input of an OR-gate 23, respectively. The pulses are also retarded by a fraction of a period by a retardation circuit 24.

The retarded meandering signals are shown in line 25 of FIG. 2b and are delivered to an inverting input of the AND-gate 22 and an inverting input of the OR-gate 23, respectively. The inverted signal is shown in line 26 of FIG. 2b. By ANDing the signals of line 21 and line 26, the pulses shown in line 27 are obtained. By ORing of the same signals, the pulses shown in line 28 are produced.

By means of the division of the output pulses of the AND-gates 201-232 (see FIG. 1a) each into two pulses temporally offset from one another by one-half period, the result is that the number of counting pulses is doubled, so that the accuracy is doubled as well. However, the precondition for this is a suitable interlacing of all the pulses emitted by the pulse formers 301-332. Care should be taken that the temporal retardation from one tap of the delay chain 100 to the next should amount to only two nanoseconds, but that the time difference between the pulses at the upper outputs of the pulse formers and the pulses at the lower outputs of the pulses formers should be 32 nanoseconds.

The sequence with which the individual counting pulses arrive is schematically shown in FIG. 3a. In addition, the inputs A-H of the OR-gates 51-58 shown in FIG. 1b are compared with the counting pulses. The counting pulses of the outputs 401-432 are contained in a cycle represented by arrows, while the inputs of the OR-gates are shown in a second cycle, which is run through at the same frequency.

The table shown in FIG. 3b also again shows the association of the outputs of the pulse formers 301-332 to the inputs of the OR-gates 51-58.

Figure 1A:
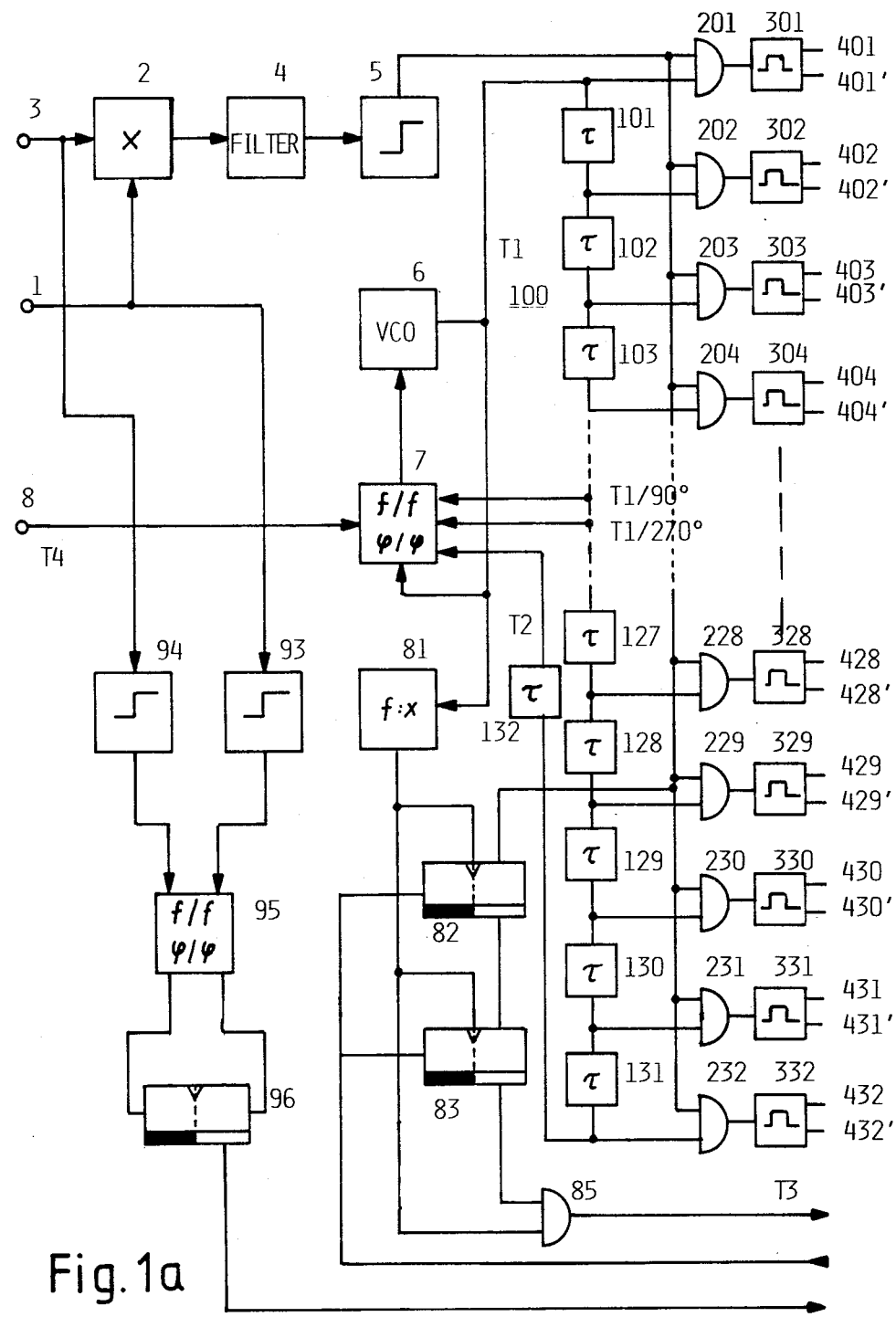
FIG. 1 is a block circuit diagram of a circuit for performing the method according to the invention, which because it is so extensive is divided into FIGS. 1a and 1b.
Figure 1B:
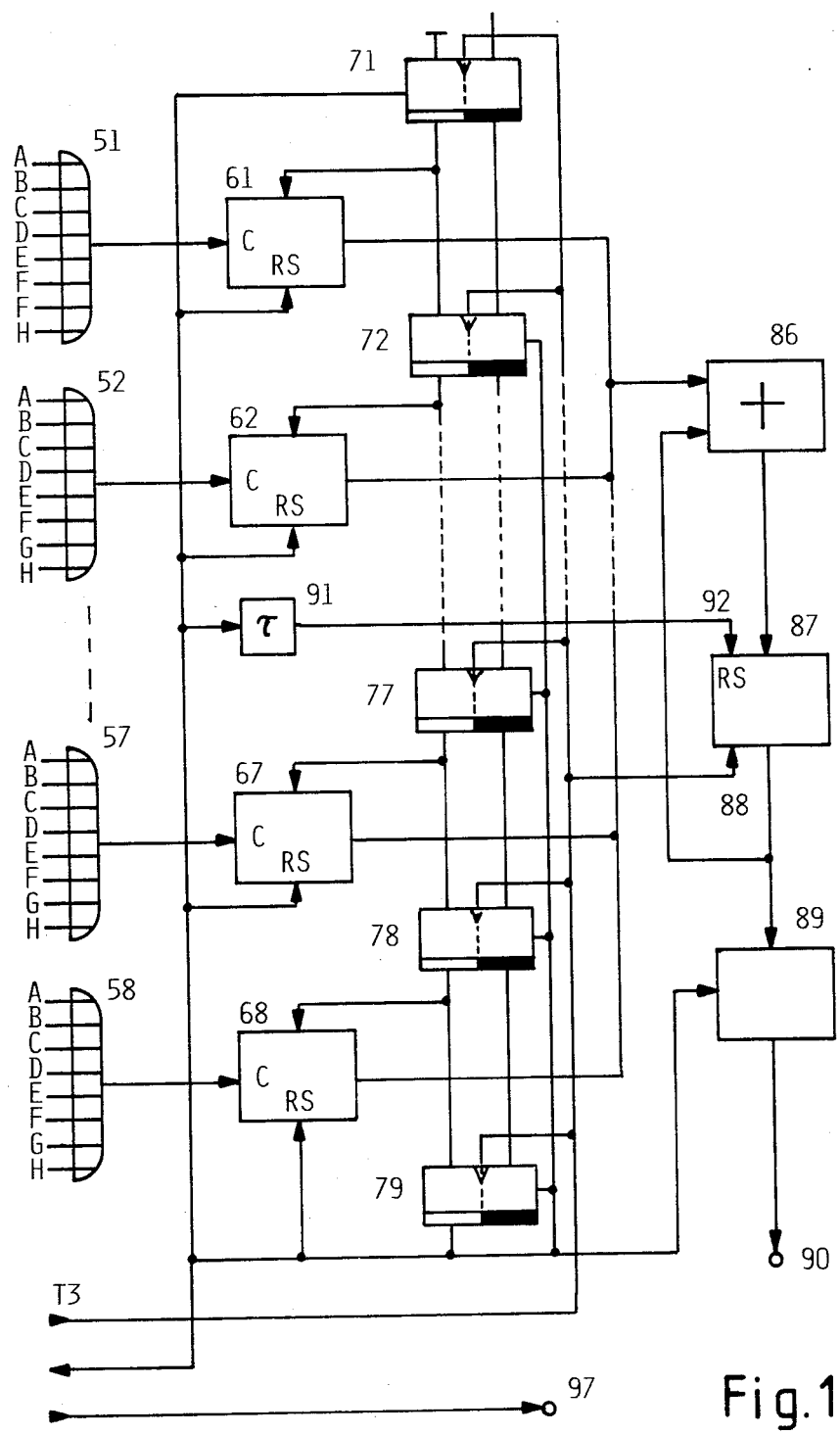

FIG. 4 is a block circuit diagram of the frequency and phase comparator 7 (FIG. 1a). To provide that the controllable oscillator 6 (FIG. 1) oscillates about a frequency at which the output clock pulse T1 is retarded by precisely 1 period over the entire delay chain 100, first (after the circuit is switched on) the desired frequency is established with a frequency comparator. Next, with a fast phase comparator, the phase at the input and at the output of the delay chain is regulated to 0° or 360°. In this process monitoring is continuously performed as to whether regulation of the controllable oscillator should be effected using the frequency comparator or using the phase comparator. To this end, the signal T1 generated by the controllable oscillator 6 is fed to the circuit of FIG. 2 via the input 41 and reaches a frequency divider 42.

The output signal of the frequency divider 42 is mixed in a D flip-flop 43 with a reference signal T4 fed at 44. At the output of the D-flip-flop 43, a signal having the differential frequency is available. From each positive and negative edge of this signal, with the aid of the delay circuit 45 and the EXCLUSIVE OR-gate 46, a short pulse is derived that transfers the counter state of one counter 47 to a memory 48 and then resets the counter 47. The counter 47 counts the clock pulses of the reference signal T4, in each case between adjacent pulses, at the output of the EXCLUSIVE OR-gate 46. The counter 47 counts up to an upper threshold limit valve, to avoid an overflow. In a comparator 49, the contents of the memory 48 are compared with a predetermined value K. If the contents of the memory 48 are less than the value K, then the frequency comparator 31 is switched on, and the switches 32 and 33 are then conductive, while the switches 34 and 35 are non-conductive. Otherwise, the phase comparator 50 is used.

Because the phase regulation must be very fast and very precise, a differential amplifier is used as the phase comparator 50, the output signal of which, given phase agreement, is zero volts, and if there are deviations between the clock signals T1 and T2 its output signal is positive or negative. Via output stage 36, the control voltage is fed to the controllable oscillator 6 (FIG. 1a). The delay chain 100 includes taps or terminals in which the phase rotation of the signal T1, in the presence of the command frequency, is 90° or 270°. These signals T1/90° and T1/270°, after ANDing with the output signal of the phase comparator 50 (FIG. 4) in the circuit of the 4 via the AND-gates 37 and 38, determine when the switches 34 and 35 are closed, on the precondition that from the comparator 49 a corresponding signal is fed to the other inputs of the AND-gates 37 and 38, this signal signifying that the frequencies of the signals T1 and T4 deviate only slightly from one another.

For further explanation of the circuit of FIG. 4, signals that arise in that circuit are shown in FIG. 5. They are labelled with the same symbols as the points of the circuit at which they arise. The signals are shown for two cases. In case A, the aggregate delay of the delay chain is too slight, while in case B the aggregate delay is too great.

The signal $T\frac{1}{2}$ is the output signal of a differential amplifier that functions as the phase comparator 50 (FIG. 4). The output voltage is negative if T1 is smaller than T2, zero if T1 is equal to T2 and positive if T1 is greater T2. The signal $T\frac{1}{2}$ is now ANDed with the signals T1/90° and T1/270°, whereupon the negative values of $T\frac{1}{2}$ are set to zero. The result is the signals $T\frac{1}{2}+T1/90°$, abbreviated as TX, and $T\frac{1}{2}+T1/270°$, abbreviated as TY, with which the gates 37 and 38 (FIG. 4) are controlled.

Various changes and modifications may be made, and features described in connection with one embodiment may be used with other embodiments, within the scope of the inventive concept.

I claim:

1. Method of continuously measuring with high precision the frequency of a radio-frequency signal (3) by counting pulses and outputting the resulting count (90) as a digital signal, comprising the steps of
    deriving (2,4,5) count pulses from clock pulses (T1), said count pulses having a frequency which is a multiple of the frequency of said clock pulses,
    feeding said count pulses to a chain (100) of delay elements (101-131),
    tapping output pulses at respective taps or terminals of said delay elements,
    counting said output pulses in a plurality of counters (61-68); and
    adding together the contents of said counters (61-68) after a time interval corresponding to a cycle or portion of a cycle of said signal (3).

2. Method according to claim 1, further comprising measuring the frequency of a sinusoidal signal by converting it into a digital signal, and
    performing a logic operation using said digital signal and said clock pulses as inputs.

3. Method according to claim 2, further comprising measuring the frequency of a frequency-modulated signal having a carrier signal mixed therewith.

4. Method according to claim 3, further comprising obtaining a pilot signal by frequency and phase comparison of an amplitude-limited frequency-modulated signal with an amplitude-limited carrier signal.

5. A circuit for continuously measuring with high precision the frequency of a radio-frequency signal (3), wherein
    an oscillator (6) is provided, generating a sequence of clock pulses (T1) and having an output connected to the input of
    a chain (100) of delay elements (101-131) producing at their respective outputs progressively retarded respective count impulse signals;
    the frequency of the count impulses taken together being an integer multiple of the frequency of said clock pulses (T1);
    a plurality of AND-gates (201-231), having first and second inputs, are provided;
    said input of said chain (100) and respective taps between adjacent ones of said delay elements (101-131) being connected to respective first inputs and said AND-gates;
    a rectangular voltage signal (5), having a frequency corresponding to the frequency of the signal to be measured (3), is provided and is applied to said second inputs of said AND-gates;
    a plurality of OR-gates (51-58) is provided;
    a plurality of counters (61-68) is provided;
    said OR-gates (51-58) having inputs connected to respective outputs of said AND-gates, and outputs connected to respective inputs of said counters (61-68);
    said counters (61-68) having inputs connected to respective outputs of said OR-gates (51-58) and outputs connected to an addition-and-memory circuit (86,87,89).

6. A circuit according to claim 5, wherein pulse formers (301-332) are each incorporated between the outputs of the AND-gates (201-232) and the inputs of the OR-gates (51-58), the pulse formers at a first output (401-432) emitting pulses triggered by the leading edges of the pulses supplied and at a second output (401'-432') emitting pulses triggered by the trailing edges.

7. A circuit according to claim 5, wherein
    the frequency of the oscillator (6) is controllable with the aid of a frequency comparator (31) and a phase comparator (50),
    the clock pulses and a signal having a reference frequency are fed to the frequency comparator (31),
    the clock pulses from the output from the output of the oscillator (6) and from the output of the delay chain (100) are fed to the phase comparator (50), and
    a switchover arrangement (32-35, 42-49) is provided, which switches over the frequency comparator (31) to the phase comparator (50) as a function of whether the difference between the reference frequency and the clock frequency drops below a predetermined value.

8. A circuit according to claim 5, wherein
    outputs of the counters (61-68) are connected via a cyclic switchover means with the addition-and-memory circuit (86,87, 89),
    switchover pulses can be fed to the switchover means from a frequency divider (81) via a gate circuit (82-85), the input of the frequency divider (81) being connected to the output of the oscillator (6), and the gate circuit (82–85) is controllable such that after a counting-out time segment has elapsed, switchover pulses are fed to the switchover means, and such that the feeding of the switchover pusles is suppressed if the switchover means has completed one switchover cycle.

9. A circuit according to claim 8, wherein
the switchover means is embodied by a shift register (71–79) and the output register of the counters (61–68),
the switchover pulses are fed as clock pulses to the shift register, and
one output of one of the flip-flops forming the shift register (71–79) is connected with reset inputs of the counters of the shift register and with one control input of the gate circuit (82–85).

10. A circuit according to claim 5, wherein
the adding-and memory circuit (86, 87, 89) is embodied by an adder (86), a summing memory (87) and an output memory (89),
one input of the adder (86) is connected via a switchover means to the ouptuts of the counters (61–68) and the other input of the adder (86) is connected to one output of the summing memory (87),
one input of the summing memory (87) is connected to the output of the adder (86), and
the output of the summing memory (87) is connected to one input of the output memory (89).

11. A circuit according to claim 5, wherein each delay element (101–131) retards a signal passing therethrough for a period on the order of a few nanoseconds.

12. A circuit according to claim 5, wherein the frequency of said clock pulses (T1) is on the order of 15 MHz.

13. Method according to claim 1, wherein said integral (3) being measured has a frequency on the order of 10 megahertz.

14. Method according to claim 1, wherein said signal being measured is an Intermediate-Frequency (IF), Frequency-Modulated (FM) signal.

15. Method according to claim 1, wherein the frequency of said signal (3) is resolved with an accuracy of about 12 bits, that is, 1 part in 4,096.

* * * * *